(12) United States Patent
Petruzzi et al.

(10) Patent No.: US 9,843,319 B2
(45) Date of Patent: Dec. 12, 2017

(54) SYSTEM AND METHOD FOR A FAULT PROTECTION CIRCUIT

(71) Applicant: Infineon Technologies AG, Neubiberg (DE)

(72) Inventors: Luca Petruzzi, Goedersdorf (AT); Bernhard Schaffer, Villach (AT); Florian Brugger, Villach (AT); Mario Tripolt, Ferndorf (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 318 days.

(21) Appl. No.: 14/629,907

(22) Filed: Feb. 24, 2015

(65) Prior Publication Data
US 2016/0248242 A1    Aug. 25, 2016

(51) Int. Cl.
| | |
|---|---|
| H02H 3/08 | (2006.01) |
| H02H 5/04 | (2006.01) |
| H02H 7/18 | (2006.01) |
| H02H 7/20 | (2006.01) |
| H03K 17/082 | (2006.01) |

(52) U.S. Cl.
CPC ................... *H03K 17/082* (2013.01)

(58) Field of Classification Search
CPC .............. H03K 17/082; Y02B 70/16
USPC .......................................... 361/18
See application file for complete search history.

(56) References Cited

U.S. PATENT DOCUMENTS

| | | | |
|---|---|---|---|
| 5,784,626 A * | 7/1998 | Odaohara | H02J 1/10 307/66 |
| 8,284,581 B2 | 10/2012 | Ivanov | |
| 2010/0181826 A1* | 7/2010 | Fuller | B60R 16/03 307/9.1 |

\* cited by examiner

*Primary Examiner* — Thienvu Tran
*Assistant Examiner* — Kevin J Comber
(74) *Attorney, Agent, or Firm* — Slater Matsil, LLP

(57) ABSTRACT

According to an embodiment, a fault protection system includes a first power supply terminal, a second power supply terminal, an error circuit configured to receive a power supply signal, and a power supply circuit coupled to the error circuit, the first power supply terminal, and the second power supply terminal. The power supply circuit is configured to provide the power supply signal from the first power supply terminal during a first operation mode and provide the power supply signal from the second power supply terminal during a second operation mode.

29 Claims, 11 Drawing Sheets

SYSTEM AND METHOD FOR A FAULT PROTECTION CIRCUIT

TECHNICAL FIELD

The present invention relates generally to electronic circuit, and, in particular embodiments, to a system and method for a protection circuit.

BACKGROUND

A power semiconductor device is a semiconductor device that may be used as a switch or rectifier for power electronics. For example, a switch-mode power supply (SMPS) often includes one or more power semiconductor switches as a key element in switching operation. Power semiconductor devices, which may be referred to as power devices, are often formed as integrated circuits (ICs) to produce power ICs. The applications of power devices are numerous and advances in technology have further increased the number of possible applications, especially in the field of power ICs.

Power devices are most commonly implemented as power switches in order to operate in either a conduction mode (ON) or a non-conduction mode (OFF). In such applications, power switches are often optimized to operate in either conduction or non-conduction modes, while limiting operation as a power transistor in the linear mode. Often power devices are used to conduct or block a large voltage that is intended to be supplied to a load.

Some common power devices are the power diode, thyristor, power metal-oxide-semiconductor field effect transistor (MOSFET), and insulated gate bipolar transistor (IGBT). The power diode and power MOSFET operate based on similar mechanisms as low power CMOS diodes and MOSFETs, for example, but are able to conduct larger currents and are typically able to support, or block, a larger reverse-bias voltage in the off-state (non-conducting).

Due to the increased current or voltage generally associated with power devices, a power device is often structurally designed in order to accommodate the higher current density, higher power dissipation, or higher breakdown voltage. For example, power devices are often built using a vertical structure and have a current rating proportional to the device's area and a voltage blocking capability related to the height or thickness of the device in the substrate. With vertical power devices, as compared to lateral non-power devices, one of the device terminals is located on the bottom of the semiconductor die.

Power devices often include protection mechanisms to prevent overcurrent or over temperature situations. In certain applications, such protection mechanisms include intelligent elements, such as control and protection circuits, for monitoring and controlling the operation of one or more power devices, such as power switches. Such intelligent elements operate to disable power devices when overcurrent or over temperature occurs. In some situations, existing protection mechanisms may fail to protect switching devices. In various applications, improved protection mechanisms for switching devices are desired.

SUMMARY

According to an embodiment, a fault protection system includes a first power supply terminal, a second power supply terminal, an error circuit configured to receive a power supply signal, and a power supply circuit coupled to the error circuit, the first power supply terminal, and the second power supply terminal. The power supply circuit is configured to provide the power supply signal from the first power supply terminal during a first operation mode and provide the power supply signal from the second power supply terminal during a second operation mode.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely fault protection systems, and more particularly, fault protection and error systems for power switches. Some of the various embodiments described herein include fault protection and error systems for parallel power switches, error counter and retry circuits for power switches, automotive systems with power switches, and power supply fault operation circuits for power switches. In other embodiments, aspects may also be applied to other applications involving any type of fault protection or error system according to any fashion as known in the art.

In various applications, such as automotive systems, power switches may be used to couple a voltage supply to outputs in order to supply power to various loads with different power requirements, for example. During operation of a power switch, damage may be prevented by operation of an error circuit configured to switch off the power switch when an error condition is detected and generate an error signal based on a detected error condition that may include an overcurrent or over temperature in the power switch, for example. The error signal is supplied to an error and retry counter coupled to the power switch. The error and retry counter is configured to disable the power switch for an extended period if error conditions occur repeatedly. In some applications, the system may have a fault in a main power supplied.

According to various embodiments, a low power or fault mode is activated when a fault occurs in a main regulated power supply such as a main regulated voltage VDD. During a low power or fault mode, the low power mode control line or an unregulated supply voltage may be used to power a fault protection system in order to maintain protection and prevent damage to the power switch or power switches. In various embodiments, the fault protection system includes an error and retry counter and maintains operation of the error and retry counter by supplying power through the low power mode control line to the error and retry counter when a fault occurs in the main regulated voltage VDD. Various embodiments are described herein in reference to the figures.

Figure 1:
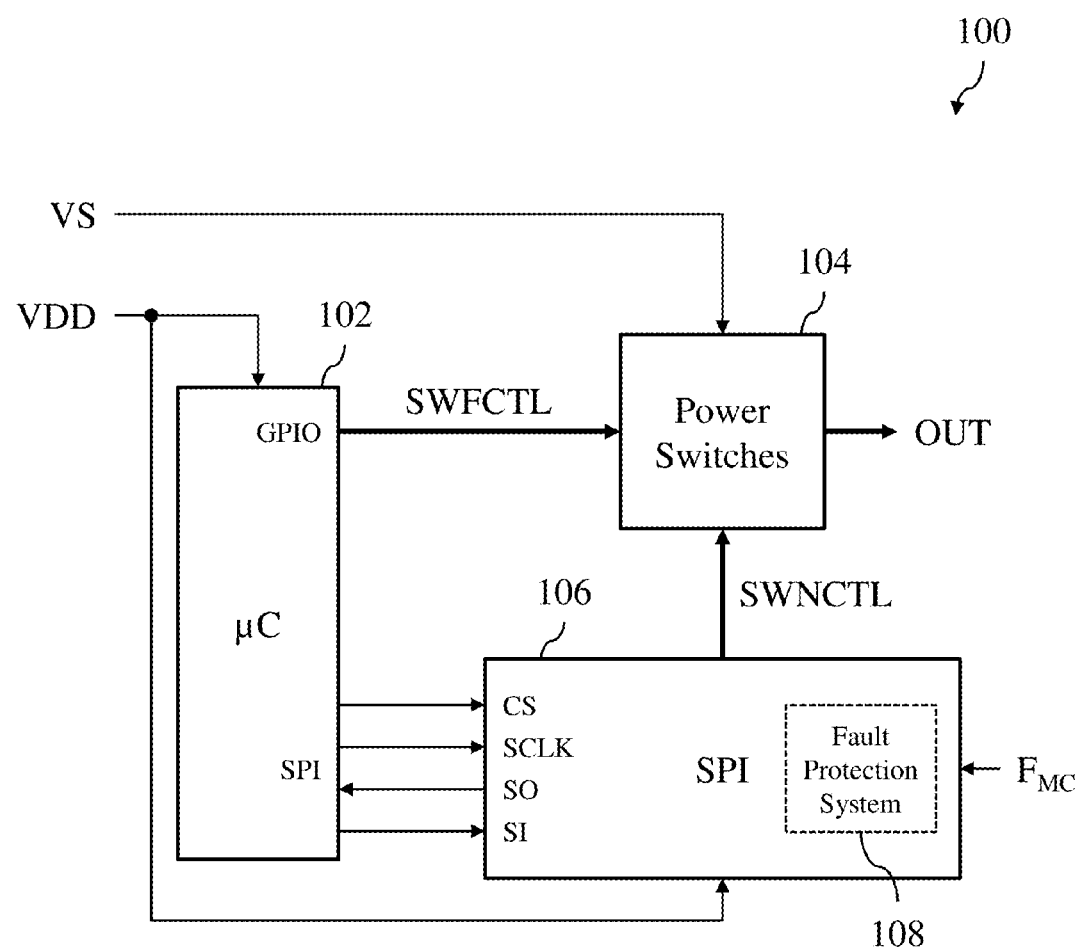
FIG. 1 illustrates a system block diagram of an embodiment power switching system.

FIG. 1 illustrates a system block diagram of an embodiment power switching system 100 including microcontroller (μC) 102, power switches 104, and serial peripheral interface (SPI) controller 106. According to various embodiments, power switches 104 supply power from supply voltage VS to loads coupled to output bus OUT based on control signals from microcontroller 102 and SPI controller 106. SPI controller 106 includes fault protection system 108 for protecting each power switch in power switches 104. Fault protection system 108 may include error and retry counters coupled to each power switch.

In an embodiment, microcontroller 102 communicates with SPI controller 106 through an SPI bus that includes control signal CS, serial clock signal SCLK, serial output signal SO, and serial input signal SI. Based on signals received through the SPI bus, SPI controller 106 provides normal mode switch control signals SWNCTL to power switches 104. Each power switch in power switches 104 has an input coupled to supply voltage VS and an output coupled so as to supply a load though output bus OUT, which may include any number of outputs corresponding to any number of power switches and loads. In one embodiment, supply voltage VS is provided by a battery. In a more specific embodiment, supply voltage VS is provided by a battery in an automotive system and the loads coupled to output bus OUT include but are not limited to automotive elements such as elements of a climate control system, elements of emergency safety systems, vehicle lights, power windows, and power locks, for example.

In various embodiments, SPI controller 106 receives fault mode control FMC, which indicates when a fault has occurred in main regulated voltage VDD. In various embodiments, fault mode control FMC may be supplied from a power system monitoring circuit. In one such embodiment, fault mode control FMC is implemented as a limp home input (LHI) from a system basis chip (SBC) in an automotive power system for activating a limp home operation mode.

In various embodiments, SPI controller 106 uses fault mode control FMC to receive power and maintain operation of the fault protection system when main regulated voltage VDD experiences a fault, which may be referred to as fault mode operation. In some such embodiments, when main regulated voltage VDD experiences a fault, SPI controller may be disabled and unable to control switching of power switches 104 based on the SPI bus. During such fault mode operation, microcontroller 102 may control power switches 104 directly through fault mode switch control signals SWFCTL. Thus, power switches 104, or a subset of the power switches included therein, may continue switching during a fault mode in order to maintain system loads that are critical to operation.

According to one embodiment, power switching system 100 is implemented in an automotive system and fault mode operation may be referred to as limp home mode. In such an embodiment, vehicle lights may be supplied through power switches 104 during limp home mode operation, while other less critical output loads may be disabled. In such an embodiment, fault mode switch control signals SWFCTL control some of power switches 104 to maintain a power supply to the vehicle lights while SPI controller 106 does not operate due to the fault in main regulated voltage VDD. Although SPI controller 106 is unable to control switching, fault protection system 108 is supplied with power by fault mode control FMC directly and continues to protect power switches 104. In some specific embodiments, fault mode control FMC supplies power to error and retry counters in order to prevent damage from continued overcurrent or over temperature conditions. In various embodiments, the fault protection system may include any type of protection circuits and the power switching system may be implemented in any type of system, such as automotive, industrial, or medical applications, for example.

In various embodiments, during normal operation when main regulated voltage VDD does not experience a fault, microcontroller 102 communicates with SPI controller 106 through the SPI bus to generate normal mode switch control signals SWNCTL for power switches 104. Thus, in normal mode operation, fault mode switch control signals SWFCTL may be unused. In some embodiments, microcontroller 102 may also receive feedback signals (not shown) from power switches 104 at an analog input pin (not shown) and may modify switching information transmitted over the SPI bus to SPI controller 106 based on feedback received from power switches 104. In some embodiments, fault mode switch control signals SWFCTL may be supplied by general purpose I/O pins (GPIO) on microcontroller 102. Further details and embodiments are described herein below in reference to the other Figures.

Figure 2A:
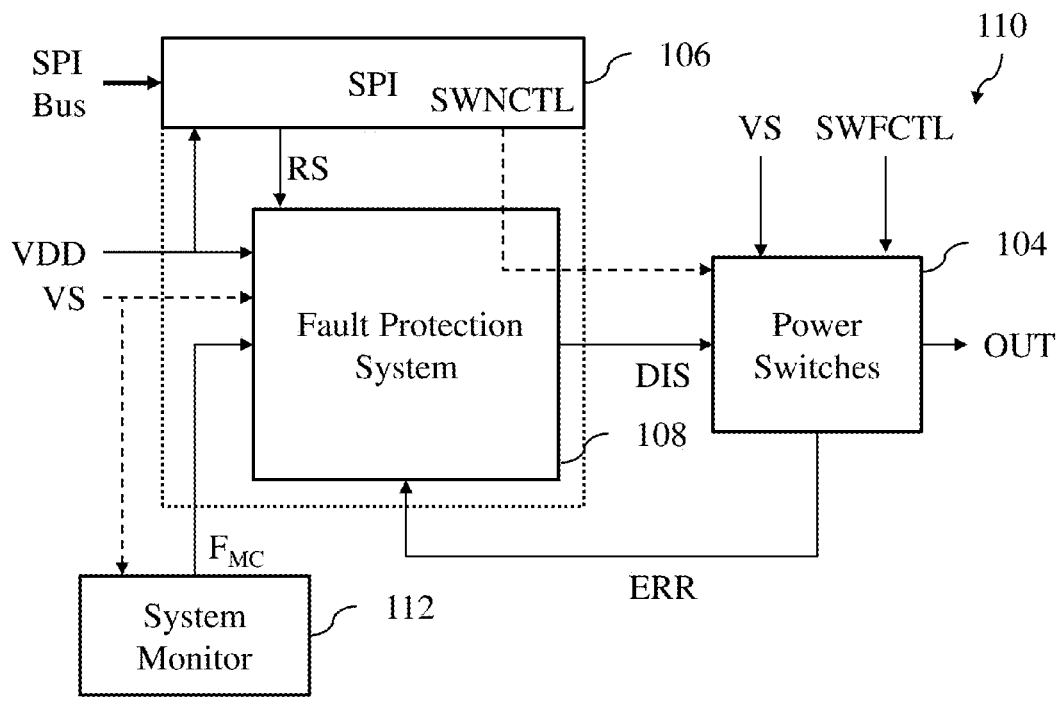
FIGS. 2a and 2b illustrate a system block diagram of an embodiment protection system and a waveform diagram of an embodiment method of operation for the protection system, respectively.

FIG. 2a illustrates a block diagram of an embodiment protection system 110 that is one embodiment implementation of a portion of power switching system 100. According to various embodiments, protection system 110 includes power switches 104, SPI controller 106, and fault protection system 108. SPI controller 106 supplies normal mode switch control signals SWNCTL to power switches 104 during operation in a non-fault mode, e.g., a normal mode, and another control circuit, such as microcontroller 102 as described in reference to FIG. 1, supplies fault mode switch control signals SWFCTL to power switches 104 during a fault mode. As similarly described hereinabove, power switches 104 couple supply voltage VS to output loads coupled to outputs OUT, which may be represented as an output bus with multiple connections.

In various embodiments, power switches 104 may include overcurrent or over temperature detection circuits that generate error signals ERR. In specific embodiments, each power switch in power switches 104 includes an error detection circuit that generates an error signal. All such error signals may be represented by error signals ERR, which also may be represented as an error bus with multiple lines for conveying all of the error signals ERR. In such embodiments, fault protection system 108 is configured to receive error signals ERR and generate disable signals DIS based on error signals ERR. Disable signals DIS may also be represented as a disable bus with a disable line for each power switch in power switches 104. For example, when error signals ERR indicate that an error condition occurs multiple times in a specific power switch, the specific power switch may be disabled until a reset signal RS is received from SPI controller 106. In various embodiments, any number of power switches 104 may be implemented along with the corresponding number of disable signals DIS, error signals ERR, and outputs OUT.

Figure 2B:
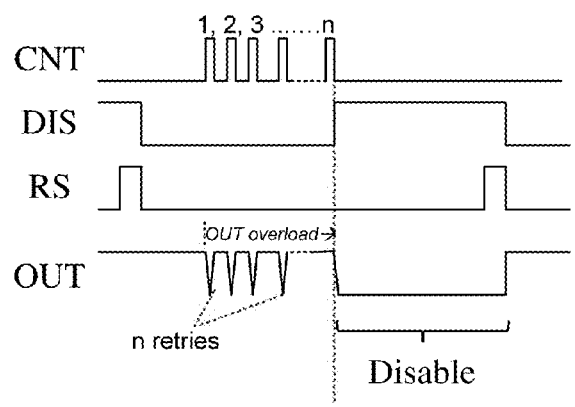

In some embodiments, fault protection system 108 includes error and retry counters for power switches 104. FIG. 2b illustrates a waveform diagram of such an embodiment method of operation for the protection system 110. In such embodiments, FIG. 2b shows operation of a single error and retry counter for a single power switch in power switches 104. Count value CNT is incremented each time an error signal from error signals ERR is received indicated an error in the single power switch. As shown, count value CNT is incremented each time the value of an output from outputs OUT for the single power switch experiences an overload condition. In some embodiments, the overload condition is detected by an overcurrent or an over temperature.

When an overload condition is detected in the value of an output from outputs OUT, the single power switch is disabled and count value is incremented. After a brief delay, the single power switch is re-enabled, which may be referred to as a retry. After each retry, when another overload condition is detected, the single power switch is disabled and count value CNT is incremented again. As continued overload conditions are detected for each retry, count value CNT is incremented up to a retry limit n. During the time when the single power switch continues to experience overload conditions, reset signal RS and disable signal DIS are held in a deactivated state. When count value CNT reaches n, disable signal DIS is set to an activated state (i.e., the disable signal is activated) in order to disable the single power switch for an extended period of time. As shown, as long as disable single DIS is activated, the output value is disabled. The single power switch may be re-enabled once reset signal RS is activated to reset the count value and continue operation of the single power switch. In such embodiments, reset value RS resets the count value to the initial value and sets disable signal DIS back in the deactivated state. In various embodiments, description of the single power switch and associated error and retry counter may be applied to each power switch in power switches 104. In other embodiments, fault protection system 108 may include other types of error or protection circuits.

In various embodiments, fault protection system 108 is coupled to receive signals or power from main regulated voltage VDD and fault mode control FMC. In such embodiments, when main regulated voltage VDD does not experience a fault, fault protection system 108 receives power from main regulated voltage VDD in order to protect power switches 104 from damage, such as described in reference to FIG. 2b, for example. When main regulated voltage VDD experiences a fault, fault protection system 108 may receive power from fault mode control FMC. In such embodiments, fault mode control FMC is generated as a control signal in system monitor 112 attached to fault protection system 108. System monitor 112 may include a separate voltage limiter coupled to supply voltage VS that is used to generate fault mode control FMC as a voltage limited stable control signal. In another embodiment, system monitor 112 may include an active voltage regulator. In some particular embodiments, a voltage limiter uses passive components including resistors and diodes, for example, to provide a voltage limiting functionality, while a voltage regulator includes active components in order to provide active voltage regulation, such as in a switching regulator, for example. In various embodiments, fault mode control FMC is used as a control signal to activate a fault mode and is used as a voltage limited stable power supply for fault protection system 108. During fault mode operation, fault protection system 108 continues to operate internal error systems, such as error and retry counters, for protecting power switches 104 based on power received from fault mode control FMC.

In specific embodiments, protection system 110 is a portion of an automotive system and fault mode control FMC is an implementation of a limp home input (LHI) from system basis chip (SBC), which is one implementation of system monitor 112, that is configured to detect a fault in main regulated voltage VDD and monitor aspects of the automotive system. In such embodiments, LHI is used to enable operation of power switches 104 and of fault protection system 108 during a fault or limp home mode while operation of SPI controller 106 is disabled. Thus, LHI supplies power to fault protection system 108 and maintains operation of error systems within fault protection system 108, such as error and retry counters, during limp home mode in order to maintain protection of power switches 104.

In further embodiments, fault protection system 108 may also be configured to receive power from supply voltage VS. Supply voltage VS may be supplied from a battery, such as an automotive battery. In some embodiments, the battery may provide supply voltage VS ranging from 10 V to 42 V. In one specific embodiment, the battery provides supply voltage VS at 12 V. In various embodiments, fault protection system 108 may include an additional voltage limiter or regulator for receiving supply voltage VS and generating a voltage limited supply for operation during a fault mode. In such embodiments, when main regulated voltage VDD experiences a fault, supply voltage VS may be used to provide power in order to continue operation of fault protection system 108.

In various embodiments, a fault in main regulated voltage VDD may include any type of event that affects the supply of power through main regulated voltage VDD. In some embodiments, a fault may occur when main regulated voltage VDD is removed and drops to supply zero power. In another embodiment, a fault may occur when main regulated voltage VDD experiences fluctuation from the specified target regulated value. For example, main regulated voltage VDD may be specified as 5 V. In such embodiments, faults may occur when main regulated voltage VDD varies above 5.5 V or below 4.5 V, for example. In other embodiments, faults may include only low voltage thresholds. For example, fault may occur when main regulated voltage VDD decreases below 4.5 V. In other embodiments, the threshold or thresholds for a fault in main regulated voltage VDD may be set to other values.

In some embodiments, fault protection system 108 may be partitioned separately from SPI controller 106, and is coupled between power switches 104 and SPI controller 106. In other embodiments, fault protection system 108 may be included in SPI controller 106. In particular embodiments, SPI controller 106 and fault protection system 108 may be integrated on a same semiconductor die as a single integrated circuit (IC). In other embodiments, SPI controller 106 is formed on a separate IC from fault protection system 108. In still further embodiments, fault protection system 108 is formed of discrete components and attached to a common circuit board as SPI controller 106.

According to various embodiments, normal mode switch control signal SWNCTL may be combined with disable signal DIS in fault protection system 108. In such embodiments, only a single control signal is used to control switching and the single control may be disabled within fault protection system 108 as described herein. For example, disable signal DIS may be combined with normal mode switch control signal SWNCTL through combinational logic included in or separate from fault protection system 108 in some embodiments.

In general, embodiments are described herein in reference to multiple power switches and multiple corresponding circuits coupled to the multiple power switches. In one embodiment, a single power switch with a single fault protection system is also envisioned with operation as described herein in reference to fault protection system 108, for example.

Figure 3A:
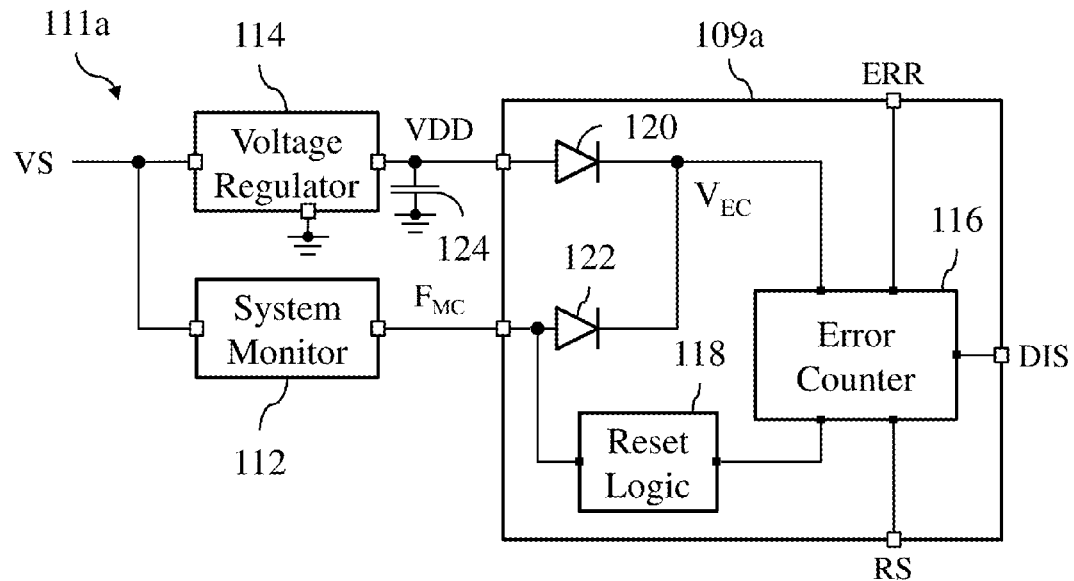
FIGS. 3a, 3b, 3c, 3d, and 3e illustrate schematic diagrams of embodiment subsystems.

FIGS. 3a, 3b, 3c, 3d, and 3e illustrate schematic diagrams of embodiment subsystems. FIG. 3a illustrates a schematic diagram of a first embodiment subsystem 111a including fault protection system 109a, system monitor 112, and voltage regulator 114. According to various embodiments, fault protection system 109a is an implementation of fault protection system 108 described hereinabove in reference to FIG. 2a. Fault protection system 109a may include error counter 116, reset logic 118, and diodes 120 and 122.

In various embodiments, error counter 116 receives voltage supply VEC through diode 120 or diode 122 from main regulated voltage VDD or fault mode control FMC, respectively. During a normal operation mode, voltage regulator 114 generates main regulated voltage VDD from supply voltage VS, which may be provided by a battery, for example. Capacitor 124, at the output of voltage regulator 114 may provide further stabilization to main regulated voltage VDD. In some embodiments, voltage regulator 114 provides main regulated voltage VDD through diode 120, which is forward biased, to error counter 116 as voltage supply VEC during a normal operation mode. In such embodiments, a normal operation mode may include operation when main regulated voltage VDD does not experience a fault or a fault that affects the power supply. Main regulated voltage VDD may be used to supply multiple ICs or components (not shown). For example, main regulated voltage VDD may supply other chips, including a microcontroller, in an automotive system in one embodiment.

In various embodiments, system monitor 112 generates fault mode control FMC during a fault operation mode. In such embodiments, system monitor provides fault mode control FMC through diode 122, which is forward biased, to error counter 116 as voltage supply VEC during a fault operation mode. During a fault operation mode, diode 120 may be reverse biased because main regulated voltage VDD may vary below a voltage threshold for forward biasing diode 120. Simultaneously, fault mode control FMC is activated to indicate a fault in main regulated voltage VDD. As described hereinabove in reference to FIG. 2a, system monitor 112 may include a voltage limiter coupled to supply voltage VS that generates a voltage limited stable control signal as fault mode control FMC for activating a fault operation mode. In such embodiments, fault mode control FMC is operable to forward bias diode 122 and supply power to error counter 116 as voltage supply VEC.

According to various embodiments, error counter 116 operates as described hereinabove in reference to FIG. 2b and fault protection system 109a implements a protection system for power switches, such as power switches 104, that is independent of a main regulated voltage supply, such as main regulated voltage VDD. In various embodiments, fault protection system 109a may be an implementation of a portion of fault protection system 108 in order to implement fault protection for each switch in power switches 104 as described hereinabove in reference to FIGS. 1 and 2a.

In various embodiments, main regulated voltage VDD and fault mode control FMC may have a range of voltages. For example, main regulated voltage VDD is 5 V in one embodiment. In another embodiment, main regulated voltage VDD is 3.3 V. In other embodiments, main regulated voltage VDD may range from 2.5 V to 7.5 V. In alternative embodiments, main regulated voltage VDD may be outside this range. Similarly, fault mode control FMC may be 5 V when activated and 0 V when deactivated in an embodiment. In other embodiments, fault mode control FMC ranges from 1.5 to 7.5 V when activated and less than 1.5 V when deactivated. In alternative embodiments, fault mode control FMC may be outside this range when activated or deactivated.

In some embodiments, supply voltage VS may be provided by a battery. In a specific embodiment, supply voltage VS is provided by a battery with a voltage range from 10 V to 14 V. In some embodiments, supply voltage VS may range from 10 V to 42 V. In alternative embodiments, supply voltage VS may be outside this range.

In some embodiments, as described hereinabove in reference to FIGS. 2a and 2b, system monitor 112 may be implemented as an SBC for an automotive system, and fault mode control FMC may be implemented as an LHI for activating limp home mode for some fault situations.

According to various embodiments, error counter 116 generates disable signal DIS when the internal count value reaches an error limit. Disable signal DIS disables the power switch (not shown), for example, to which error counter 116 is coupled. In other embodiments, disable signal DIS and error signal ERR may be coupled to any type of component with error protection. In various embodiments, disable signal DIS continues to disable the power switch, for example, until error counter 116 is reset. In some embodiments, error counter 116 may be reset by reset signal RS from, e.g., microcontroller 102 or SPI controller 106, or by reset logic 118. Reset logic 118 may identify falling or rising edges of fault mode control FMC, indicating an end or deactivation of fault mode, and generate a reset for error counter 116 based on the falling or rising edge, in one embodiment. In other embodiments, reset logic 118 may identify falling or rising edges of an input control signal (not shown) and may generate a reset for error counter 116 based on the input control signal. In a further embodiment, error counter 116 may include a single reset terminal coupled to reset logic 118. In such embodiments, reset logic 118 receives reset signal RS and generates a reset for error counter 116 based on reset signal RS and fault mode control FMC. In other embodiments, reset logic 118 may also be coupled to main regulated voltage VDD or supply voltage VS (not shown) and generate reset for error counter 116 based each available signal or voltage.

Figure 3B:
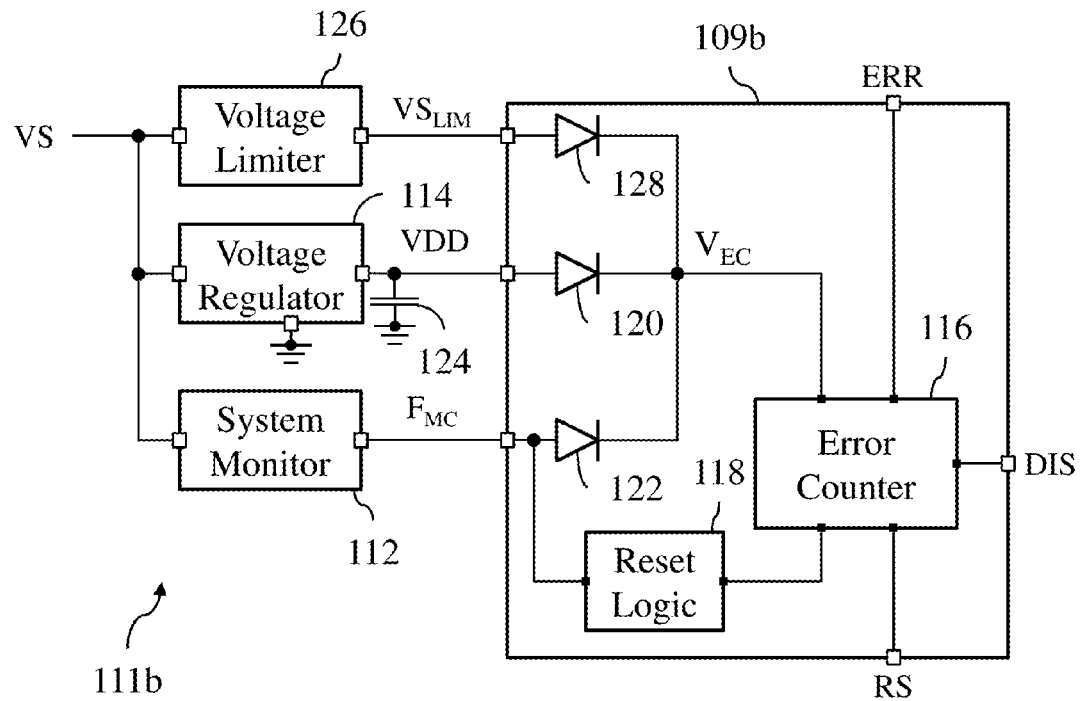

FIG. 3b illustrates a schematic diagram of a second embodiment subsystem 111b including fault protection system 109b, system monitor 112, voltage regulator 114, and voltage limiter 126. According to various embodiments, subsystem 111b operates as similarly described hereinabove in reference to subsystem 111a in FIG. 3a and description of common elements applies to elements in FIG. 3b. Fault protection system 109b additionally includes diode 128 configured to provide voltage supply VEC to error counter 116. In various embodiments, supply voltage VS is provided through voltage limiter 126 and diode 128 to provide voltage supply VEC to error counter 116. As described hereinabove, main regulated voltage VDD may experience a fault. During a fault operation mode, voltage supply VEC may be provided through diode 122 by fault mode control FMC or through diode 128 by limited supply voltage VSLIM. In some embodiments, diode 122 and the coupling to system monitor 112 may be omitted and voltage supply VEC may be provided only through diode 128 by limited supply voltage VSLIM during a fault operation mode.

In various embodiments, voltage limiter 126 may generate limited supply voltage VSLIM that ranges from 2.5 V to 7.5 V. In one embodiment, voltage limiter 126 may generate limited supply voltage VSLIM as 5 V. In some embodiments, voltage limiter 126 is implemented on a separate component, such as a separate IC, as fault protection system 109b. In other embodiments, voltage limiter 126 is implemented on a same component, such as a same IC, as fault protection system 109b.

Figure 3C:
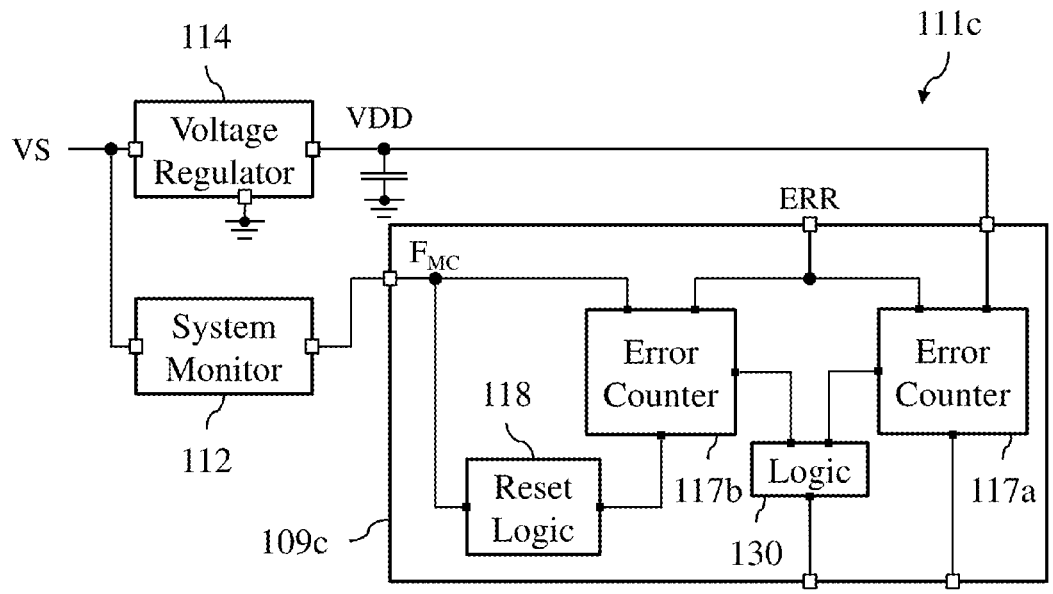

FIG. 3c illustrates a schematic diagram of a third embodiment subsystem 111c including fault protection system 109c, system monitor 112, and voltage regulator 114. According to various embodiments, subsystem 111c operates as similarly described hereinabove in reference to subsystem 111a in FIG. 3a and description of common elements applies to elements in FIG. 3c. In various embodiments, fault protection system 109c includes a different internal organization compared to fault protection system 109a described hereinabove in reference to FIG. 3a.

Fault protection system 109c includes error counters 117a and 117b, which operate in a similar manner as described herein in reference to error counter 116. In such embodiments, error counter 117a operates during a normal operation mode as described hereinabove and is powered directly by main regulated voltage VDD. When a fault occurs in main regulated voltage VDD, leading to a fault operation mode, error counter 117a may be disabled and lose power. During a fault operation mode, error counter 117b operates as described hereinabove and is powered directly by fault mode control FMC. In various embodiments, logic circuit 130 receives disable signals from error counters 117a and 117b and generates disable signal DIS in order to disable a power switch, for example, as described hereinabove. In one specific embodiment, logic circuit 130 is an OR gate. In various embodiments, reset logic 118 provides reset control for error counter 117b and reset signal RS provides reset control for error counter 117a.

Figure 3D:
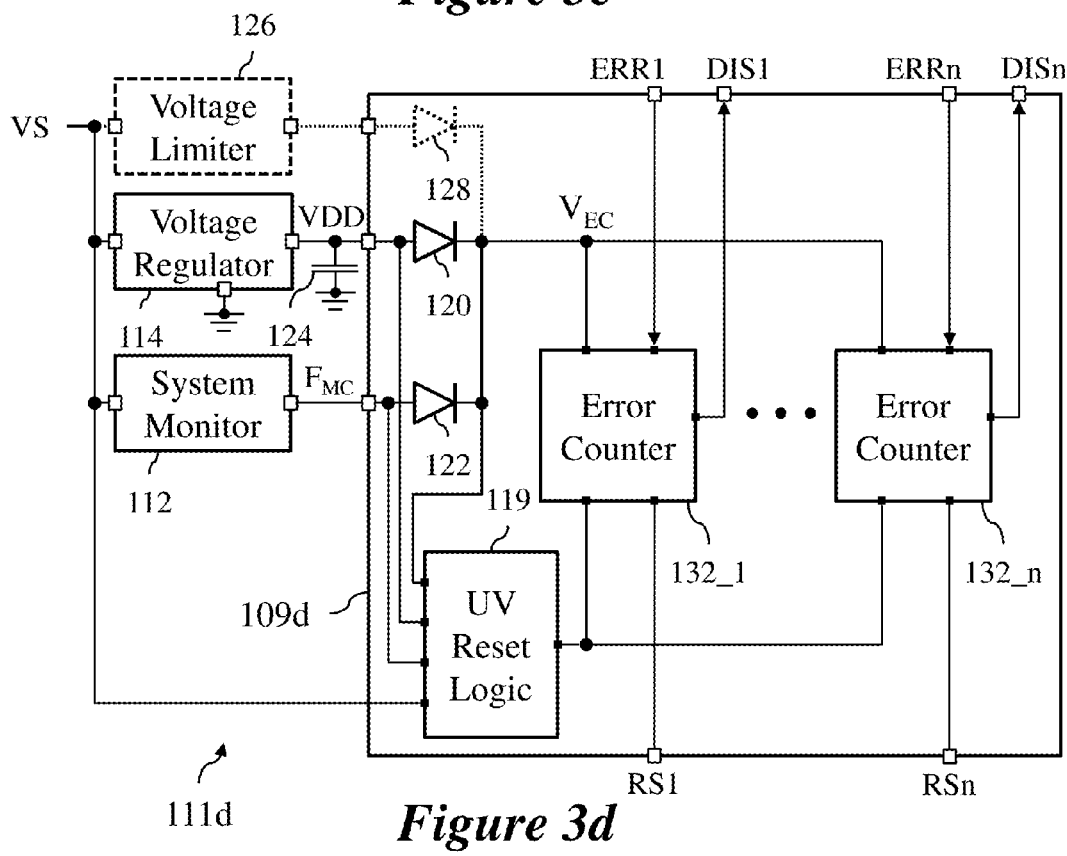

FIG. 3d illustrates a schematic diagram of a fourth embodiment subsystem 111d including fault protection system 109d, system monitor 112, and voltage regulator 114. According to various embodiments, subsystem 111d operates as similarly described hereinabove in reference to subsystem 111a in FIG. 3a and description of common elements applies to elements in FIG. 3d. Fault protection system 109d includes multiple error counters 132_1-132_n, where n is any number, for protecting each power switch in power switches 104, for example. In some embodiments, n is the number of power switches and corresponding error counters included in a power system, such as power switching system 100. In particular embodiments, the number n of power switches and corresponding error counters 132_1-132_n may range from 1 to 32. In alternative embodiments, the number n may be greater than 32.

According to various embodiments, error counters 132_1-132_n operate as similarly described hereinabove in reference to error counter 116. Error counters 132_1-132_n may include internal or external combinational reset logic for controlling reset based on a reset signals received from under-voltage (UV) reset logic 119 or from reset signals RS1-RSn as shown. In various embodiments, each of error counters 132_1-132_n is coupled to a corresponding channel 1-n, respectively, where each of channels 1-n includes correspondingly numbered reset signals RS1-RSn, error signals ERR1-ERRn, and disable signals DIS1-DISn, respectively. Each channel 1-n may be coupled to a power device, such as a power switch, and the respective error counters 132_1-132n operate to disable the power device or power switch as described hereinabove in reference to error counter 116 in FIGS. 3a and 3b.

According to some specific embodiments, UV reset logic 119 has inputs coupled to each of or a combination of voltage supply VEC, main regulated voltage VDD, fault mode control FMC, and supply voltage VS. The output of UV reset logic 119 provides a reset signal to each of error counters 132_1-132_n. In various specific embodiments, each of error counters 132_1-132_n may be reset when voltage supply VEC or main regulated voltage VDD drops below a fault threshold, when fault mode control FMC experiences a falling edge corresponding to an end of a fault operation mode, or supply voltage VS drops below a supply threshold. In such various embodiments, UV reset logic 119 may have any configuration and number of the four inputs shown.

In various embodiments, voltage limiter 126 and diode 128, as described hereinabove in reference to FIG. 3b, are optional. In one embodiment, voltage limiter 126 and diode 128 may be included and diode 122 and the coupling between fault protection system 109d and system monitor 112 may be omitted.

Figure 3E:
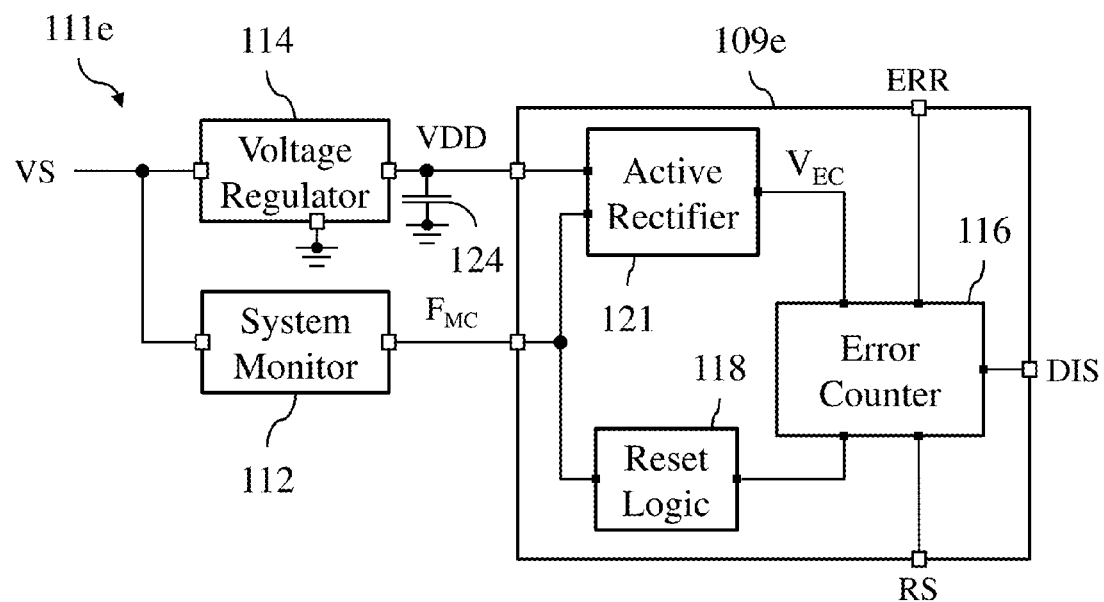

FIG. 3e illustrates a schematic diagram of a fifth embodiment subsystem 111e including fault protection system 109e, system monitor 112, and voltage regulator 114. According to various embodiments, subsystem 111e operates as similarly described hereinabove in reference to subsystem 111a in FIG. 3a and description of common elements applies to elements in FIG. 3e. In place of diodes 120 and 122, fault protection system 109e includes active rectifier 121 configured to provide voltage supply VEC to error counter 116. In various embodiments, supply voltage VS is provided through voltage regulator 114 and active rectifier 121 to provide voltage supply VEC to error counter 116. As described hereinabove, main regulated voltage VDD may experience a fault. During a fault operation mode, active rectifier 121 may detect that fault mode control FMC has a larger voltage than main regulated voltage VDD. In such embodiments, active rectifier 121 selects the larger voltage and supplies voltage supply VEC.

Figure 4A:
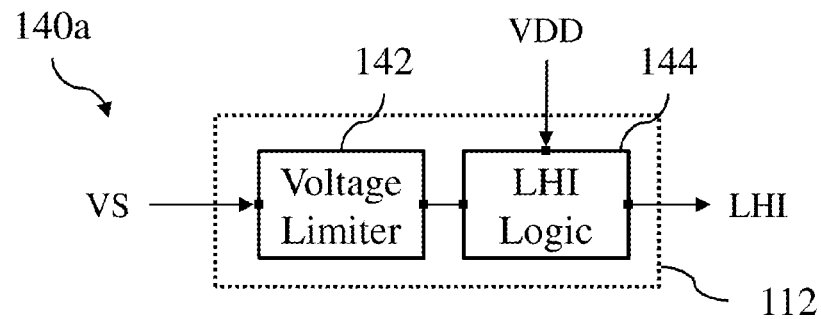
FIGS. 4a, 4b, and 4c illustrate schematic diagrams of example components for embodiment power switching systems.
Figure 4B:
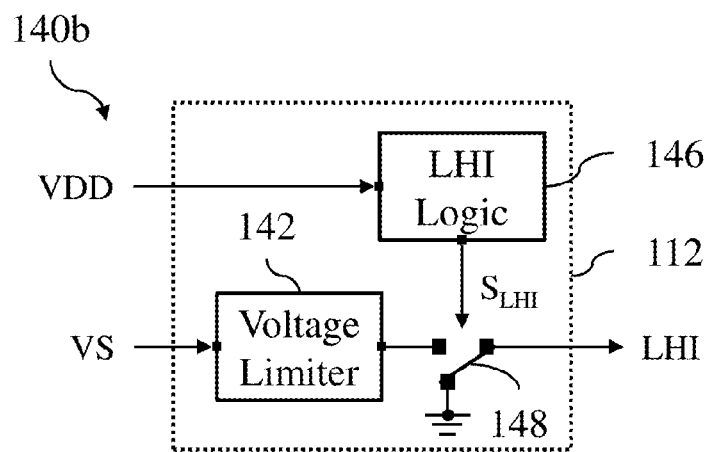
Figure 4C:
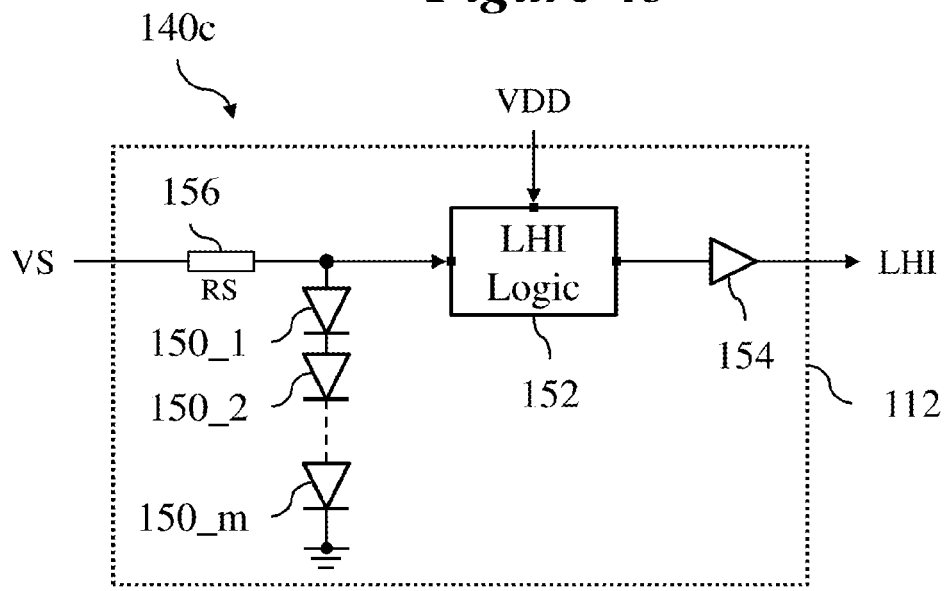

FIGS. 4a, 4b, and 4c illustrate schematic diagrams of example components 140a, 140b, and 140c for embodiment power switching systems including configurations for system monitor 112. According to various embodiments, system monitor 112 may be implemented as multiple types of system fault or error monitoring. In various embodiments, system monitor 112 may be formed as a separate IC or may be formed of discrete components coupled to a system circuit board. In one embodiment, system monitor 112 is formed as a separate IC in an automotive system. In some specific embodiments, system monitor is implemented as a system basis chip (SBC) that monitors the automotive system for errors or faults and generates control signals based on the system monitoring.

In various embodiments, system monitor 112 is implemented as an SBC with a limp home input LHI for an automotive system, for example. Component 140a represents one embodiment of system monitor 112 implemented as an SBC. In such embodiments, component 140a includes voltage limiter 142 and LHI logic 144. Voltage limiter 142 receives supply voltage VS and generates a voltage limited supply for LHI logic 144. LHI logic 144 monitors main regulated voltage VDD and drives limp home input LHI with a drive voltage when a fault is detected in main regulated voltage VDD. LHI logic 144 may include combinational logic or may also include analog circuits. For example, LHI logic may include a comparator for comparing main regulated voltage VDD to a fault threshold. In various embodiments, the drive voltage for limp home input LHI may be 5 V, for example. In further embodiments, the drive voltage for limp home input LHI may be any of the voltages as described hereinabove in reference to fault mode control FMC.

Component 140b represents another embodiment of system monitor 112 implemented as an SBC. In such embodiments, component 140b includes voltage limiter 142, as described hereinabove, LHI logic 146, and switch 148. LHI logic 146 operates in a similar manner as LHI logic 144, but generates switch control SLHI for switch 148 based on detecting a fault in main regulated voltage VDD. Switch 148 is controlled by switch control SLHI to either provide 0 V as limp home input LHI, corresponding to no fault in main regulated voltage VDD, or provide a drive voltage as limp home input LHI, corresponding to a fault in main regulated voltage VDD. The drive voltage may include any of the values as described hereinabove in reference to component 140a and fault mode control FMC.

Component 140c represents another embodiment of system monitor 112 implemented as an SBC. In such embodiments, component 140c includes voltage limiting diodes 150_1, 150_2, ..., and 150_m, LHI logic 152, LHI driver 154, and series resistor 156. Voltage limiting diodes 150_1, 150_2, ..., and 150_m may include any number m of voltage limiting diodes. Each diode of voltage limiting diodes 150_1, 150_2, ..., and 150_m are coupled in series between supply voltage VS and a low reference terminal, such as ground. LHI logic 152 operates in a similar manner as LHI logic 144 to generate a logic signal for limp home input LHI based on detecting a fault in main regulated voltage VDD. The logic signal is provided to LHI driver 154, which provides either 0 V as limp home input LHI, corresponding to no fault in main regulated voltage VDD, or provides a drive voltage as limp home input LHI, corresponding to a fault in main regulated voltage VDD. The drive voltage may include any of the values as described hereinabove in reference to component 140a and fault mode control FMC. In one embodiment, LHI driver 154 is implemented as an output buffer. In various embodiments, supply voltage VS is coupled to voltage limiting diodes 150_1, 150_2, ..., and 150_m through series resistor 156 in order to limit current through voltage limiting diodes 150_1, 150_2, ..., and 150_m. In further embodiments, an additional isolation circuit or resistive circuit may be included to provide separation between supply voltage VS and the voltage limiting function of voltage limiting diodes 150_1, 150_2, ..., and 150_m.

In various embodiments, system monitor 112 implemented as an SBC in components 140a, 140b, and 140c may include additional functions with corresponding controllers or circuits (not shown) depending on the specific system application. Those of skill in the art will readily appreciate that such features may be included in envisioned embodiments. For example, an SBC may control watchdog functions, fail safe operation, and under or over voltage protection. In some embodiments, various voltage limiting functions described in reference to FIGS. 4a, 4b, and 4c may be implemented outside of the SBC.

Figure 5A:
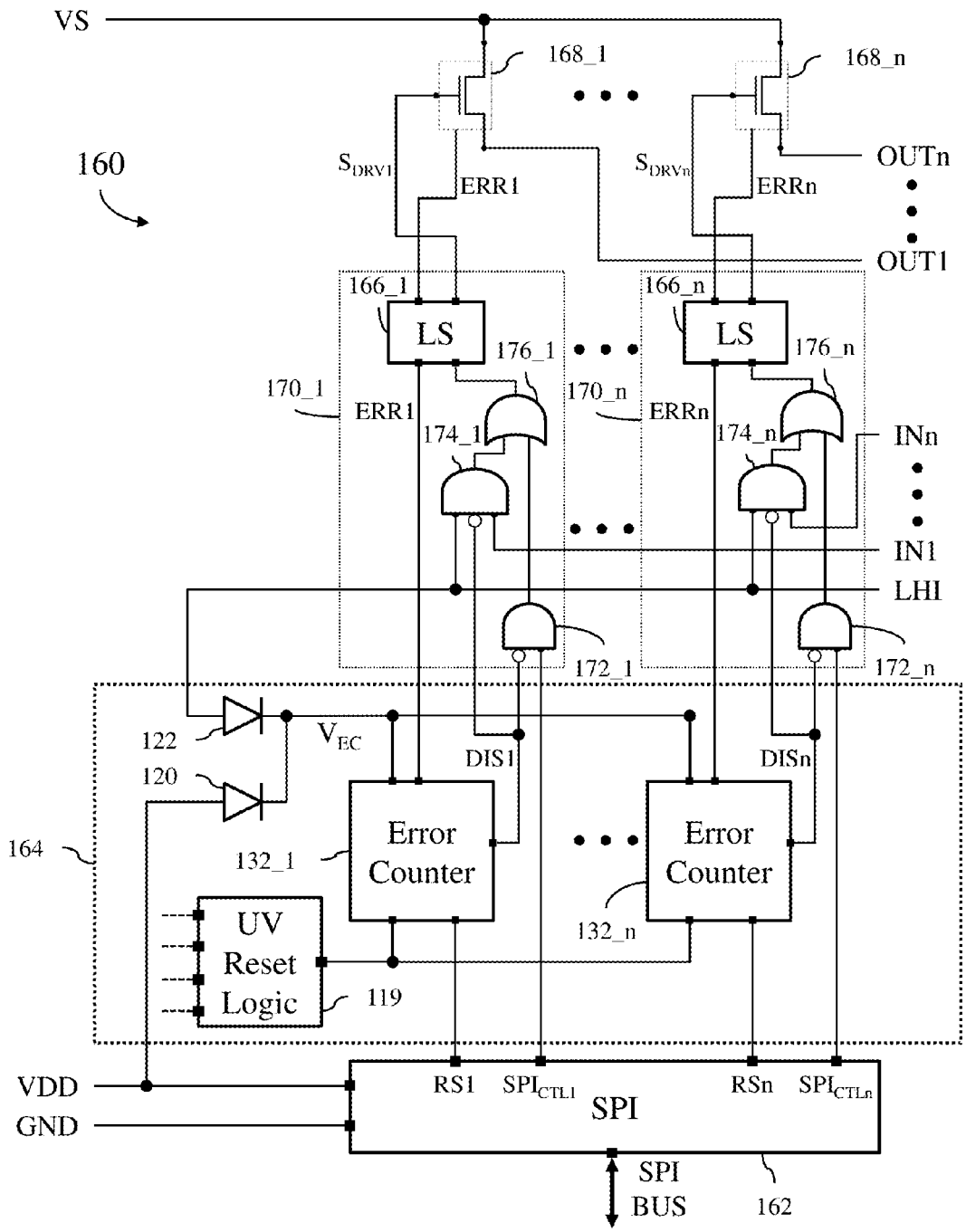
FIGS. 5a and 5b illustrate schematic diagrams of another embodiment power switching system.

FIG. 5a illustrates a schematic diagram of another embodiment power switching system 160 including SPI controller 162, fault protection system 164, level-shift (LS) drivers 166_1-166_n in LS circuits 170_1-170_n, and power switches 168_1-168_n. According to various embodiments, each of power switches 168_1-168_n is driven by drive signals SDRV1-SDRVn, respectively, provided by LS drivers 166_1-166_n. LS circuits 170_1-170_n include LS drivers 166_1-166_n and combinational logic for enabling or disabling drive signals SDRV1-SDRVn. Power switches 168_1-168_n are switched into conduction (ON) and non-conduction (OFF) modes in order to supply power from supply voltage VS to loads attached to outputs OUT1-OUTn. Fault protection system 164 operates as similarly described hereinabove in reference to the other figures and includes a separate error channel for each of power switches 168_1-168_n. Error counters 132_1-132_n operate as described hereinabove in reference to FIG. 3d with the addition of LS circuits 170_1-170_n.

Each of LS circuits 170_1-170_n includes AND gates 172_1-172_n, AND gates 174_1-174_n, and OR gates 176_1-176_n. Each of AND gates 172_1-172_n combines the respective disable signal of disable signals DIS1-DISn with the respective SPI switch control signal of SPI switch control signals SPICTL1-SPICTLn in order to generate an enable or disable signal for each respective LS driver 166_1-166_n during normal operation. In one embodiment, each of AND gates 172_1-172_n includes an inverting input for disable signals DIS1-DISn. During fault mode operation, SPI switch control signals SPICTL1-SPICTLn may be disabled. In such embodiments, AND gates 172_1-172_n are inactive because SPI switch control signals SPICTL1-SPICTLn are inactive. At the same time, each of AND gates 174_1-174_n are activated by limp home input LHI and combine the respective disable signal of disable signals DIS1-DISn, through an inverting input, with the respective input switch control signal of input switch control signals IN1-INn. In such embodiments, each of OR gates 176_1-176_n combines signals from respective AND gates 172_1-172_n and 174_1-174_n in order to generate respective drive signals SDRV1-SDRVn.

According to various embodiments, voltage supply VEC is provided to error counters 132_1-132_n from main regulated voltage VDD during a normal operation mode and from limp home input LHI during a fault operation mode. Diodes 120 and 122 ensure voltage supply VEC is provided to error counters 132_1-132_n during a normal operation mode and a fault operation mode. In such embodiments, fault operation mode may also be referred to as limp home mode. Fault operation mode or limp home mode occurs when main regulated voltage VDD experiences as fault. For example, main regulated voltage VDD may experience a fault when main regulated voltage VDD drops below a fault threshold. The fault threshold may be set based on the system operation. In some embodiments, the fault threshold may range from 2 V to 4 V. In other alternative embodiments, the fault threshold may be outside this range. In various embodiments, limp home input LHI may be one implementation of fault mode control FMC as described hereinabove.

According to various embodiments, SPI controller 162 generates SPI switch control signals SPICTL1-SPICTLn based on information received across the SPI bus. In one embodiment, SPI switch control signals SPICTL1-SPICTLn are an implementation of normal mode switch control signals SWNCTL described hereinabove in reference to FIGS. 1 and 2a. SPI switch control signals SPICTL1-SPICTLn are provided to LS circuits 170_1-170_n, which generate drive signals SDRV1-SDRVn for power switches 168_1-168_n during a normal operation mode. During a fault operation mode, LS circuits 170_1-170_n receive input switch control signals IN1-INn at AND gates 174_1-174_n, which may be an implementation of fault mode switch control signals SWFCTL described hereinabove in reference to FIGS. 1 and 2a. For example, input switch control signals IN1-INn may be provided by a microcontroller (not shown), such as microcontroller 102. During a fault operation mode, AND gates 174_1-174_n generate, through OR gates 176_1-176_n and LS drivers 166_1-166_n, drive signals SDRV1-SDRVn for power switches 168_1-168_n based on input switch control signals IN1-INn. In such embodiments, AND gates 174_1-174_n are enabled or disabled by disable signals DIS1-DISn from error counters 132_1-132_n during a fault mode.

Further, power may be supplied to LS circuit 170_1-170_n through voltage supply VEC, which is supplied by limp home input LHI during a fault operation mode. Each of the logic gates included in LS circuits 170_1-170_n and LS drivers 166_1-166_n may be supplied by voltage supply VEC. LS circuits 170_1-170_n may also be supplied by supply voltage VS. A specific embodiment of LS circuits 170_1-170_n is described further herein below in reference to FIG. 5b.

In various embodiments, UV reset logic 119 operates as described hereinabove in reference to FIG. 3d and may be coupled (coupling not shown for simplicity) to any of or any combination of supply voltage VS, limp home input LHI, main regulated voltage VDD, and voltage supply VEC.

According to various embodiments, fault protection system 164 maintains operation and protection during normal and fault operation modes. In particular automotive embodiments, limp home input LHI, which may be generated in an SBC as a control signal indicating limp home mode, is used as a regulated voltage supply during a fault mode (i.e., limp home mode) to supply power to error counters 132_1-132_n in order to maintain protection of power switches 168_1-168_n.

In some embodiments, fault protection system 164 is implemented on a same IC as SPI controller 162. In other embodiments, fault protection system 164 and SPI controller 162 are implemented on separate ICs or separate components.

Figure 5B:
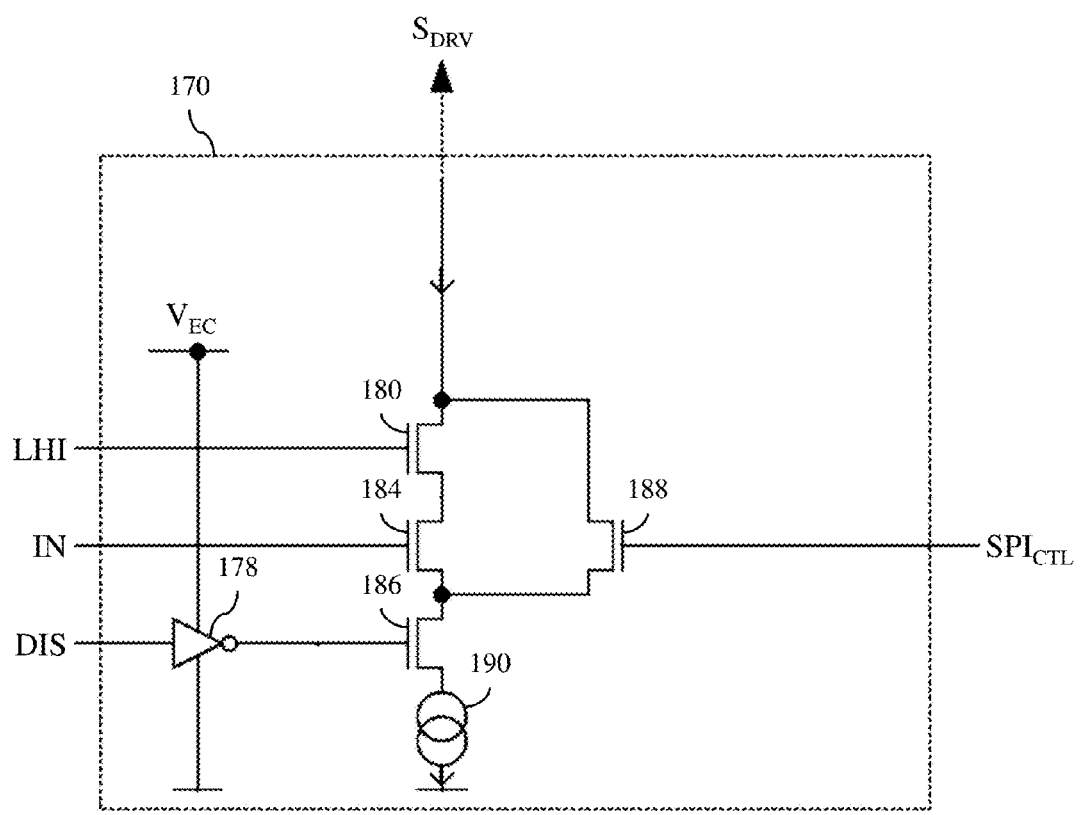

FIG. 5b illustrates a schematic diagram of an embodiment implementation of a level shifting (LS) circuit 170 for LS circuits 170_1-170_n for power switching system 160 as described hereinabove in reference to FIG. 5a. LS circuit 170 includes series connected transistors 180, 184, and 186, a parallel and series connected transistor 188, disabling inverter 178, and current sink 190. According to various embodiments, LS circuit 170 is an implementation of a single LS circuit of LS circuits 170_1-170_n, such as LS circuit 170_1 including LS driver 166_1, AND gate 172_1, AND gate 174_1, and OR gate 176_1, for example. In such embodiments, disable signal DIS, which may represent any of disable signals DIS1-DISn, provides a disable signal to transistor 186, in order to disable drive signal SDRV, which may represent any of drive signals SDRV1-SDRVn. Disable signal DIS may be driven by inverter 178, which is supplied by voltage supply VEC.

According to various embodiments, when disable signal DIS is not disabling, either transistors 180 and 184 control drive signal SDRV or transistor 188 controls drive signal SDRV. During a fault mode, SPI switch control signal SPICTL may be inactive as SPI controller 162 is inactive, as described hereinabove in reference to SPI switch control signals SPICTL1-SPICTLn. Thus, transistor 188 may be driven in a non-conducting state while transistor 180 is driven into a conducting state by limp home input LHI during a fault mode. In such embodiments, input switch control signal IN, which may represent any of input switch control signals IN1-INn, drives transistor 184 to conduct or block drive signal SDRV.

During a normal operation mode, limp home input LHI may be disabled, driving transistor 180 into a non-conducting state. In such embodiments, SPI switch control signal SPICTL may operate to drive transistor 188 to conduct or block drive signal SDRV. In both a normal operation mode and a fault mode, transistor 186 may be disabled by disable signal DIS in order to disable a power transistor, such as power transistors 168_1-168_n. As described hereinabove in reference to disable signals DIS1-DISn in FIG. 5a, disable signal DIS may be generated by any of error counters 132_1-132_n. In various embodiments, current sink 190 provides a current sink for drive signal SDRV when a conducting path through transistors 180, 184, 186, and 188 is present.

Figure 6:
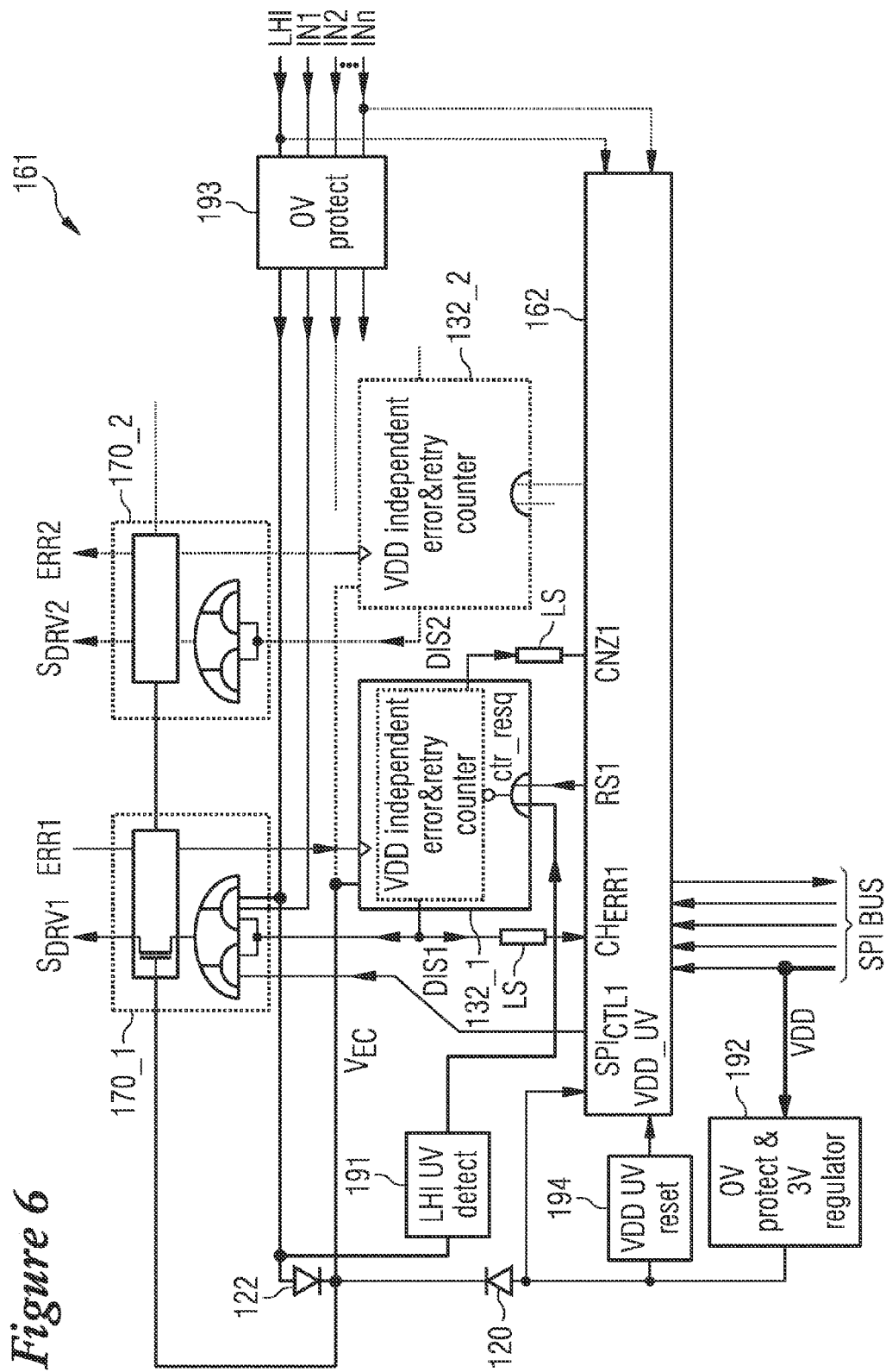
FIG. 6 illustrates a schematic diagram of a further embodiment power switching system.

FIG. 6 illustrates a schematic diagram of a further embodiment power switching system 161. According to various embodiments, power switching system 161 operates as similarly described hereinabove in reference to power switching system 160 in FIG. 5a, for example. Description of commonly numbered elements hereinabove applies to FIG. 6 and will not be repeated in the interest of brevity. In various embodiments, power switching system 161 includes error counters 132_1-132_n, SPI controller 162, LS circuits 170_1-170_n, limp home input (LHI) under-voltage (UV) detector 191, overvoltage (OV) protection and voltage regulator 192, OV protection 193, and VDD UV reset 194.

According to various embodiments, LHI UV detector 191 detects under-voltages on limp home input LHI and generates a reset signal that is logically combined with reset signals RS1-RSn from SPI controller 162 at AND gates inside error counters 132_1-132_n. VDD UV reset 194 detects an under-voltage in VDD and supplies VDD reset control signal VDD_UV to SPI controller 162. OV protection and voltage regulator 192 receives main regulated voltage VDD from the SPI BUS and monitors for over-voltages. In some specific embodiments, OV protection and voltage regulator 192 receives main regulated voltage VDD with a voltage range from 3 V to 6 V and outputs a regulated 3 V signal. In some embodiments, OV protection 193 also monitors for over-voltages on limp home input LHI or input switch control signals IN1-INn.

In some embodiments, SPI controller 162 also receives counter not zero signals CNZ1-CNZn through level-shifting resistors from respective error counters 132_1-132_n. In some further embodiments, SPI controller 162 also receives channel error signals CHERR1-CHERRn through level-shifting resistors from respective error counters 132_1-132_n. According to various embodiments, SPI controller 162 may receive signals from limp home input LHI and input switch control signals IN1-INn as shown by the dashed lines to SPI controller 162.

Figure 7:
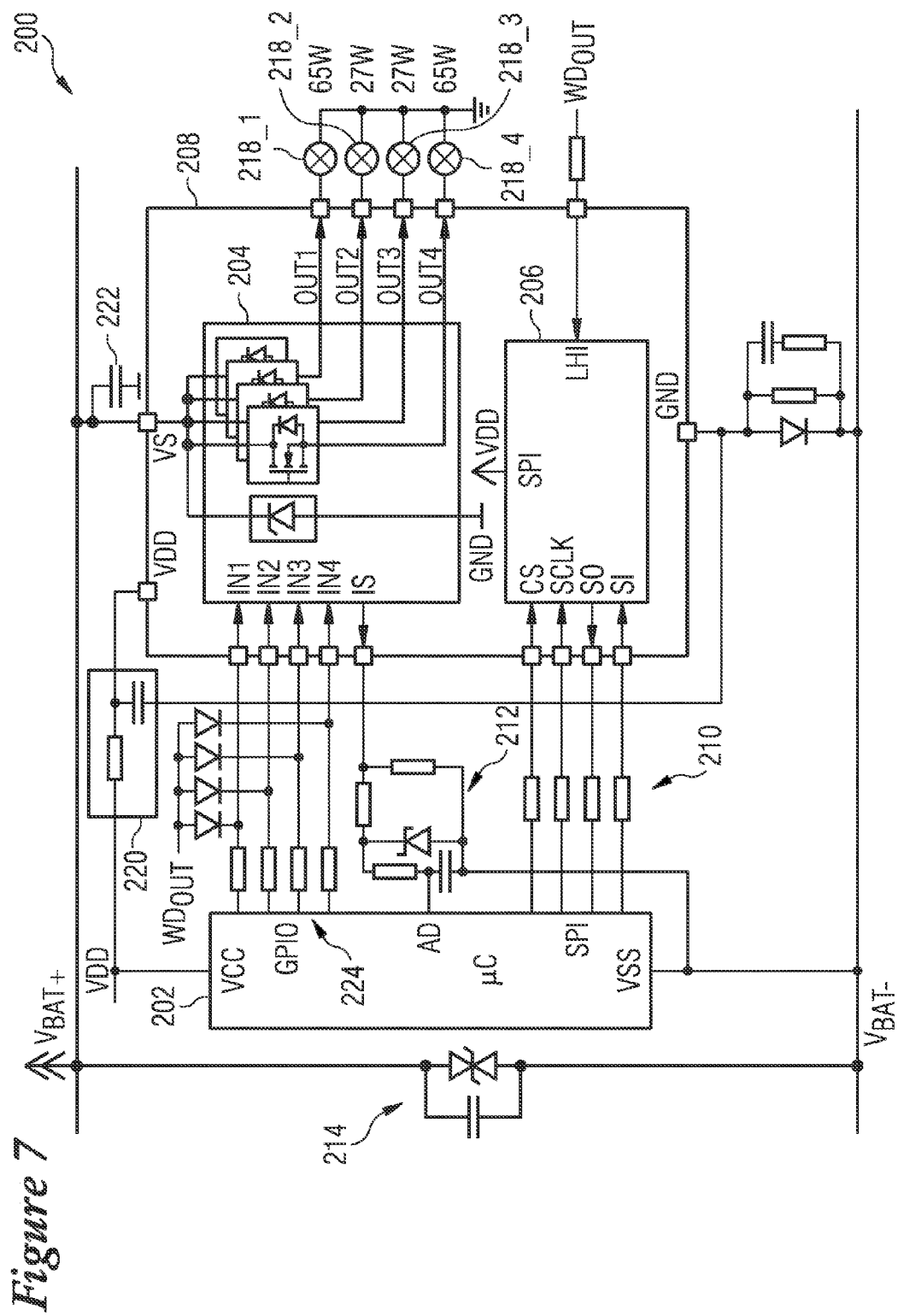
FIG. 7 illustrates a system diagram of an embodiment power switching system.

FIG. 7 illustrates a system diagram of an embodiment power switching system 200 including microcontroller (μC) 202 and multichannel switch component 208, which includes power switches 204 and SPI controller 206. According to various embodiments, SPI controller 206 interfaces with microcontroller 202 through SPI bus 210 and generates switching control signals for power switches 204. In such embodiments, SPI controller 206 includes a fault protection system as described hereinabove.

According to some embodiments, power switching system 200 is implemented in an automotive system and a fault operation mode is referred to as a limp home mode. In various embodiments, power switches 204 are controlled based on signals from SPI bus 210 and SPI controller 206 during a normal operation mode. During a fault operation mode, power switches 204 receive control signals from general purpose parallel interface circuit 224 at inputs IN1, IN2, IN3, and IN4. Further, during a fault operation mode, the fault protection system within SPI controller 206 operates based on power received from limp home input LHI to prevent damage to power switches 204 using, e.g., error counters as described hereinabove. During a normal operation mode, the fault protection system within SPI controller 206 operates based on power received from main regulated voltage VDD.

According to various embodiments, power switches 204 supply loads 218_1, 218_2, 218_3, and 218_4 coupled to outputs OUT1, OUT2, OUT3, and OUT4. In various embodiments, any number of power switches and corresponding outputs may be included. In specific embodiments, loads 218_1, 218_2, 218_3, and 218_4 draw various power levels, such as 65 W or 27 W, for example. Switching of power switches 204 may be controlled to provide specific power levels to outputs OUT1, OUT2, OUT3, and OUT4.

In various embodiments, multichannel switching component 208 is formed on a single IC with both power switches 204 and SPI controller 206 formed on the single IC. In other embodiments, power switches 204 may be formed on a first IC and SPI controller 206 may be formed an a second IC. In such embodiments, the first and second IC may be stacked or coupled to a same circuit board that implements multi-channel switch component 208.

According to various embodiments, limp home input LHI is supplied from watch dog output WDOUT, which is provided by an SBC (not shown). In such embodiments, a fault may occur anywhere in the extended automotive system, or other type of system including power switching system 200. Based on the fault in the extended automotive system, the SBC activates limp home mode and watch dog output WDOUT drives limp home input LHI for SPI controller 206 and drives general purpose parallel interface circuit 224 for limp home mode operation.

In various embodiments, additional components or circuits are included in power switching system 200. Filtering or stabilization circuit 220 is coupled between main regulated voltage VDD and multichannel switch component 208. Stabilization capacitor 222 is coupled between positive battery terminal VBAT+, which provides supply voltage VS, and multichannel switch component 208. Current sense IS is provided through feedback circuit 212 to analog to digital input AD of microcontroller 202. Transient voltage suppression (TVS) circuit 214 is coupled between positive battery terminal VBAT+ and negative battery terminal VBAT−. Reference circuit 216 provides a stable low reference or ground (GND) voltage to multichannel switch component 208. Reference pin VCC of microcontroller 202 is coupled to main regulated voltage VDD and reference pin VSS of microcontroller 202 is coupled to negative battery terminal VBAT−.

According to various such embodiments, additional circuits or modifications may be included in power switching system 200. In a specific embodiment, microcontroller 202 may be implemented as a standard microcontroller. For example, microcontroller 202 may be a microcontroller from Infineon microcontroller family XC2200. In one particular embodiment, microcontroller 202 is Infineon microcontroller XC2267.

In various embodiments, other configurations and interface protocols may be used. For example, SPI bus 210 includes control signal CS, clock signal SCLK, output signal SO, and input signal SI. In other embodiments, SPI bus 210 may include fewer signal lines, such as a single signal line or only two signal lines, for example.

Figure 8:
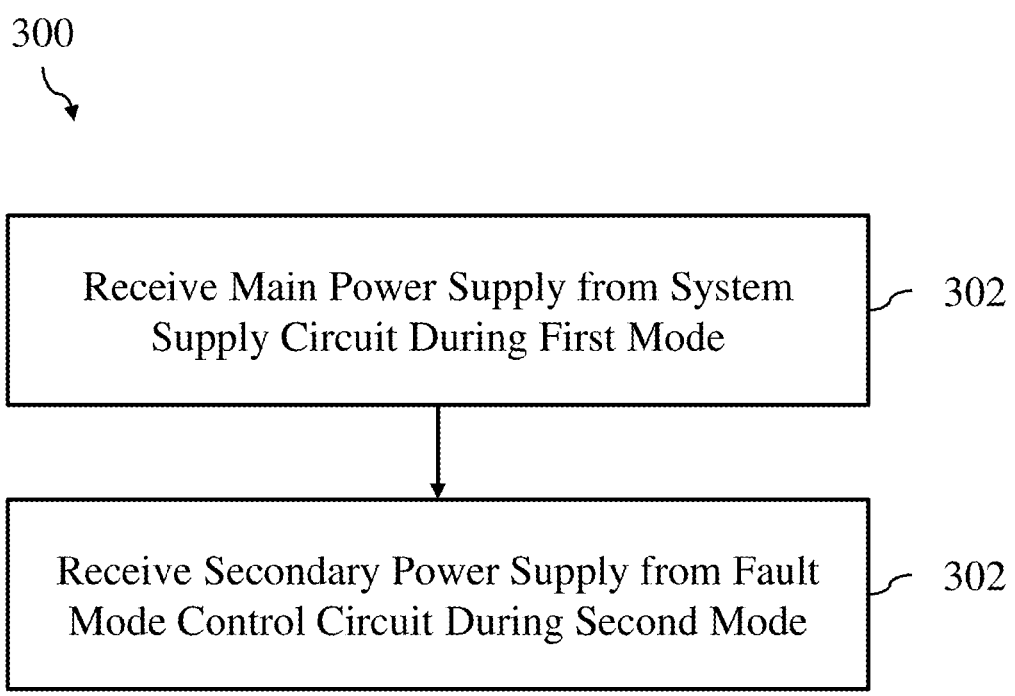
FIG. 8 illustrates a block diagram of an embodiment method of operating a fault protection system.

FIG. 8 illustrates a block diagram of an embodiment method of operation 300 for a fault protection system including steps 302 and 304. According to various embodiments, method of operation 300 is a method of operating a fault protection system. In various embodiments, step 302 includes, receiving a main power supply from a system supply circuit during a first mode. Operation in the first mode occurs when the main power supply has no detected faults. Step 304 includes receiving a secondary power supply from a fault mode control circuit during a second mode. Operation in the second mode occurs when the main power supply has a detected fault. A detected fault may include the main power supply varying below a fault threshold or an operation threshold.

According to an embodiment, a fault protection system includes a first power supply terminal, a second power supply terminal, an error circuit configured to receive a power supply signal, and a power supply circuit coupled to the error circuit, the first power supply terminal, and the second power supply terminal. The power supply circuit is configured to provide the power supply signal from the first power supply terminal during a first operation mode and provide the power supply signal from the second power supply terminal during a second operation mode.

In various embodiments, the first power supply terminal is configured to be coupled to a regulated system supply signal generated from a first power source and the second power supply terminal is configured to be coupled to a mode control signal generated from the first power source. In an embodiment, the regulated system supply signal is generated at a first voltage regulator coupled to the first power source and the mode control signal is generated at a voltage limiter or a second voltage regulator coupled to the first power source. The mode control signal is generated at a system monitor circuit configured to detect a fault in the regulated system supply signal.

In various embodiments, the system monitor circuit is configured to detect a fault when a voltage level of the regulated system supply signal is below a first threshold. The fault protection system may further include the system monitor circuit. In an embodiment, the first power source includes a battery. In some embodiments, the fault protection system operates in the first mode when the regulated system supply signal is above a first threshold, and the fault protection system operates in the second mode when the regulated system supply signal is below the first threshold. The fault protection system may operate in the first mode when the regulated system supply signal has no detected faults, and the fault protection system may operate in the second mode when the regulated system supply signal has a detected fault.

In various embodiments, the error circuit is further configured to receive an error signal from a power switch, increment an error count based on the error signal, and disable the power switch when the error count is above a first error threshold. In such embodiments, the error circuit maintains the power switch in a disabled state until the error count is below the first error threshold. The error circuit may further include a reset circuit configured to reset the error count. In an embodiment, the fault protection system further includes the power switch. In some embodiments, the fault protection system further includes a plurality of power switches and a plurality of error circuits, and each error circuit is configured to receive the power supply signal.

In various embodiments, the fault protection system further includes a voltage limiter coupled between a first power source and the second power supply terminal. In an embodiment, the power supply circuit includes a first diode coupled from the first power supply terminal to the error circuit, and a second diode coupled from the second power supply terminal to the error circuit. The power supply circuit may include an active rectifier circuit. Implementations of the various embodiments may include a circuit, hardware, a method or process, or computing systems, for example.

According to an embodiment, a method of operating a fault protection system includes receiving a main power supply from a system supply circuit during a first mode and receiving a secondary power supply from a fault mode control circuit during a second mode. Operation in the first mode occurs when the main power supply has no detected faults, and operation in the second mode occurs when the main power supply has a detected fault.

In various embodiments, the method further includes detecting a fault in the main power supply at the fault mode control circuit. In such embodiments, detecting a fault includes determining whether a voltage level of the main power supply is below a first threshold. The method may further include receiving an error signal from a power switch, incrementing an error count based on the error signal, disabling the power switch when the error count is above a first error threshold, and maintaining the power switch in a disabled state until the error count is below the first error threshold. In some embodiments, the method further includes generating the main power supply in the system supply circuit using a voltage regulator coupled to a battery. The method may also include generating the secondary power supply in the fault mode control circuit using a voltage limiter. Implementations of the various embodiments may include a circuit, hardware, a method or process, or computing systems.

According to an embodiment, a power supply system includes a plurality of power switches configured to be coupled to a power supply and to supply a plurality of loads, a plurality of switch drivers configured to supply drive signals to the plurality of power switches and receive a fault mode control signal, a plurality of fault protection circuits configured to supply disable signals to the plurality of switch drivers, and a supply circuit coupled to the plurality of fault protection circuits. The plurality of fault protection circuits are configured to be coupled to a supply voltage and to receive a plurality of error signals from the plurality of power switches. Further, the supply circuit is configured to provide the supply voltage to the plurality of fault protection circuits from a first system supply source during a first mode and to provide the supply voltage to the plurality of fault protection circuits from the fault mode control signal during a second mode.

In various embodiments, the first system supply source is generated by a voltage regulator coupled to the power supply. The power supply may include a battery. In some embodiments, the power supply system is an automotive system, the plurality of loads includes a plurality of automotive loads, and the second mode includes a limp home mode of operation for the automotive system. In an embodiment, the first mode includes operation when a voltage level of the first system supply source is above an operation threshold, and the second mode includes operation when the voltage level of the first system supply source is below the operation threshold.

In various embodiments, the first mode includes operation when the first system supply source has no detected faults, and the second mode includes operation when the first system supply source has a detected fault. In an embodiment, the power supply system further includes a system monitor circuit configured to detect faults and supply the fault mode control signal. The plurality of fault protection circuits may include a plurality of error counters. In such embodiments, each error counter is configured to receive an error signal from a corresponding power switch of the plurality of power switches, increment an error count for the corresponding power switch based on the error signal, and disable the corresponding power switch when the error count for the corresponding power switch is above a first error threshold. Each error counter maintains the corresponding power switch in a disabled state until the error count for the corresponding power switch is below the first error threshold. Implementations of the various embodiments may include a circuit, hardware, a method or process, or computing systems.

According to various embodiments described herein, advantages may include fault protection for components, such as power switches, during fault mode operation. For example, damage to power switches may be prevented when power supply faults occur by maintaining operation of protection circuits. As another example, an advantage of various embodiments may include fault protection even during failures in the main regulated voltage VDD.

According to various embodiments, descriptions included hereinabove primarily address power switches. In further embodiments, fault protection systems as described herein may be applied to any type of switching device or circuit formed as lateral or vertical semiconductor devices, for example. Thus, some embodiments are not limited specifically to power semiconductor applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A fault protection system comprising:
a first power supply terminal configured to be coupled to a regulated system supply signal generated from a first power source;
a second power supply terminal configured to be coupled to a mode control signal generated from the first power source;
an error circuit configured to receive a power supply signal; and
a power supply circuit coupled to the error circuit, the first power supply terminal, and the second power supply terminal, wherein the power supply circuit is configured to
provide the power supply signal from the first power supply terminal during a first operation mode, and
provide the power supply signal from the second power supply terminal during a second operation mode.

2. The fault protection system of claim 1, wherein
the regulated system supply signal is generated at a first voltage regulator coupled to the first power source, and
the mode control signal is generated at a voltage limiter or a second voltage regulator coupled to the first power source.

3. The fault protection system of claim 2, wherein the mode control signal is generated at a system monitor circuit configured to detect a fault in the regulated system supply signal.

4. The fault protection system of claim 3, wherein the system monitor circuit is configured to detect a fault when a voltage level of the regulated system supply signal is below a first threshold.

5. The fault protection system of claim 3, further comprising the system monitor circuit.

6. The fault protection system of claim 2, wherein the first power source comprises a battery.

7. The fault protection system of claim 2, wherein
the fault protection system operates in the first operation mode when the regulated system supply signal is above a first threshold, and
the fault protection system operates in the second operation mode when the regulated system supply signal is below the first threshold.

8. The fault protection system of claim 2, wherein
the fault protection system operates in the first operation mode when the regulated system supply signal has no detected faults, and
the fault protection system operates in the second operation mode when the regulated system supply signal has a detected fault.

9. The fault protection system of claim 1, further comprising a voltage limiter coupled between the first power source and the second power supply terminal.

10. The fault protection system of claim 1, wherein the power supply circuit comprises
a first diode coupled from the first power supply terminal to the error circuit, and
a second diode coupled from the second power supply terminal to the error circuit.

11. The fault protection system of claim 1, wherein the power supply circuit comprises an active rectifier circuit.

12. A fault protection system comprising:
a first power supply terminal;
a second power supply terminal;
an error circuit configured to receive a power supply signal, wherein the error circuit is configured to
receive an error signal from a power switch,
increment an error count based on the error signal, and
disable the power switch when the error count is above a first error threshold, wherein the error circuit maintains the power switch in a disabled state until the error count is below the first error threshold; and
a power supply circuit coupled to the error circuit, the first power supply terminal, and the second power supply terminal, wherein the power supply circuit is configured to
provide the power supply signal from the first power supply terminal during a first operation mode, and
provide the power supply signal from the second power supply terminal during a second operation mode.

13. The fault protection system of claim 12, wherein the error circuit further comprises a reset circuit configured to reset the error count.

14. The fault protection system of claim 12, further comprising the power switch.

15. The fault protection system of claim 12, further comprising a plurality of power switches and a plurality of error circuits, each error circuit configured to receive the power supply signal.

16. The fault protection system of claim 12, wherein
the first power supply terminal is configured to be coupled to a regulated system supply signal generated from a first power source; and
the second power supply terminal is configured to be coupled to a mode control signal generated from the first power source.

17. A method of operating a fault protection system, the method comprising:
receiving a main power supply from a system supply circuit during a first mode, wherein operation in the first mode occurs when the main power supply has no detected faults;
receiving a secondary power supply from a fault mode control circuit during a second mode, wherein operation in the second mode occurs when the main power supply has a detected fault;
receiving an error signal from a power switch;
incrementing an error count based on the error signal;
disabling the power switch when the error count is above a first error threshold; and
maintaining the power switch in a disabled state until the error count is below the first error threshold.

18. The method of claim 17, further comprising detecting a fault in the main power supply at the fault mode control circuit, wherein detecting a fault comprises determining whether a voltage level of the main power supply is below a first threshold.

19. The method of claim 17, further comprising generating the main power supply in the system supply circuit using a voltage regulator coupled to a battery.

20. The method of claim 19, further comprising generating the secondary power supply in the fault mode control circuit using a voltage limiter.

21. A power supply system comprising:
a plurality of power switches configured to be coupled to a power supply and to supply a plurality of loads;
a plurality of switch drivers configured to supply drive signals to the plurality of power switches and receive a fault mode control signal;
a plurality of fault protection circuits configured to supply disable signals to the plurality of switch drivers, wherein the plurality of fault protection circuits are configured to be coupled to a supply voltage and to receive a plurality of error signals from the plurality of power switches; and
a supply circuit coupled to the plurality of fault protection circuits, wherein the supply circuit is configured to provide the supply voltage to the plurality of fault protection circuits from a first system supply source during a first mode and to provide the supply voltage to the plurality of fault protection circuits from the fault mode control signal during a second mode.

22. The power supply system of claim 21, wherein the first system supply source is generated by a voltage regulator coupled to the power supply.

23. The power supply system of claim 22, wherein the power supply comprises a battery.

24. The power supply system of claim 23, wherein
the power supply system is an automotive system,
the plurality of loads comprises a plurality of automotive loads, and the second mode comprises a limp home mode of operation for the automotive system.

25. The power supply system of claim 21, wherein
the first mode comprises operation when a voltage level of the first system supply source is above an operation threshold, and
the second mode comprises operation when the voltage level of the first system supply source is below the operation threshold.

26. The power supply system of claim 21, wherein
the first mode comprises operation when the first system supply source has no detected faults, and
the second mode comprises operation when the first system supply source has a detected fault.

27. The power supply system of claim 26, further comprising a system monitor circuit configured to detect faults and supply the fault mode control signal.

28. The power supply system of claim 21, wherein the plurality of fault protection circuits comprises a plurality of error counters, wherein each error counter is configured to
receive an error signal from a corresponding power switch of the plurality of power switches,
increment an error count for the corresponding power switch based on the error signal, and
disable the corresponding power switch when the error count for the corresponding power switch is above a first error threshold, wherein each error counter maintains the corresponding power switch in a disabled state until the error count for the corresponding power switch is below the first error threshold.

29. A fault protection system comprising:
a first power supply terminal;
a second power supply terminal;
an error circuit configured to receive a power supply signal;
a power supply circuit coupled to the error circuit, the first power supply terminal, and the second power supply terminal, wherein the power supply circuit is configured to
provide the power supply signal from the first power supply terminal during a first operation mode, and
provide the power supply signal from the second power supply terminal during a second operation mode; and
a voltage limiter coupled between a first power source and the second power supply terminal.

* * * * *